United States Patent
Baniecki et al.

(10) Patent No.: US 7,935,996 B2
(45) Date of Patent: May 3, 2011

(54) ELECTRONIC DEVICE AND MANUFACTURING METHOD THEREOF

(75) Inventors: John D. Baniecki, Kawasaki (JP); Kazuaki Kurihara, Kawasaki (JP); Masatoshi Ishii, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 178 days.

(21) Appl. No.: 11/843,987

(22) Filed: Aug. 23, 2007

(65) Prior Publication Data

US 2008/0048292 A1 Feb. 28, 2008

(30) Foreign Application Priority Data

Aug. 24, 2006 (JP) ................................. 2006-228230
Mar. 16, 2007 (JP) ................................. 2007-069178

(51) Int. Cl.
*H01L 21/02* (2006.01)
*H01L 21/8242* (2006.01)

(52) U.S. Cl. ................ 257/295; 257/310; 257/E21.009; 438/3; 438/240

(58) Field of Classification Search .................. 257/295, 257/310, E21.009, E21.01; 438/3, 240
See application file for complete search history.

(56) References Cited

U.S. PATENT DOCUMENTS 6,229,166 B1 * 5/2001 Kim et al. ..................... 257/295
7,244,979 B2 * 7/2007 Iwasaki et al. ................ 257/295

FOREIGN PATENT DOCUMENTS

JP 8227980 A 9/1996
JP 200058792 A 2/2000

* cited by examiner

*Primary Examiner* — Mark Prenty
(74) *Attorney, Agent, or Firm* — Westerman, Hattori, Daniels & Adrian, LLP

(57) ABSTRACT

In a BST thin film being a capacitor film in a capacitor element, the capacitor film is formed such that two kinds of chemical states of Sr(I) and Sr(II) exist at a portion of which depth is up to 2.5 nm from a surface thereof (surface layer portion of which thickness is 2.5 nm), an average concentration of Sr(I) is set as AC(I), an average concentration of Sr(II) is set as AC(II), and when "R=AC(II)/AC(I)", a value of "R" is adjusted to be "0" (zero)<R≦0.3, more preferably, "0" (zero)<R≦0.1.

20 Claims, 13 Drawing Sheets

ELECTRONIC DEVICE AND MANUFACTURING METHOD THEREOF

CROSS-REFERENCE TO RELATED APPLICATIONS

This application is based upon and claims the benefit of priority from the prior Japanese Patent Application Nos. 2006-228230, filed on Aug. 24, 2006, and 2007-069178, filed on Mar. 16, 2007, the entire contents of which are incorporated herein by reference.

BACKGROUND OF THE INVENTION

1. Field of the Invention

The present invention relates to an electronic device including a capacitor element and a manufacturing method thereof, and in particular, an electronic device including a capacitor element in which a high dielectric constant film and a ferroelectric film are used for a capacitor dielectric film.

2. Description of the Related Art

Recently, a capacitor element used for an electronic device represented by a semiconductor device has been used for various purposes in a field of the electronic devices, as a decoupling capacitor suppressing a voltage noise and a voltage variation generated by a coupling between power bus lines, a storage capacitor of a semiconductor memory device such as a DRAM and FeRAM, an active variable element used for a microwave element, and so on.

As a capacitor film material of the capacitor element, materials with high dielectric constant, ferroelectric constant having a perovskite structure (composition formula: $ABO_3$) containing at least Sr and O, such as, for example, $SrTiO_3$ (strontium titanium oxide) (STO), (Ba (barium), Sr (strontium)) $TiO_3$ (titanium oxide) (BST) are attracting attention, as shown in Patent Documents 1, 2.

[Patent Document 1] Japanese Patent Application Laid-open No. Hei 8-227980

[Patent Document 2] Japanese Patent Application Laid-open No. 2000-58792

In the electronic device including the capacitor element having a capacitor film composed of the dielectric material having the above-stated perovskite structure, improvements of various characteristics such as a large capacity, low leak current, and longer operating time are required.

However, an alignment direction of a film has a strong relation with the characteristics in the dielectric film having the perovskite structure. Accordingly, when the alignment direction of the film is selected to optimize a certain characteristic (for example, a voltage variability of a capacity value), it is inevitable to give up the other characteristics (for example, a leak current characteristic).

Besides, it is necessary to improve the characteristics of the capacitor element from other aspects to realize further improvement of device characteristics, even when the optimization of the capacitor element is performed while specializing in a certain application. Accordingly, a structure capable of improving various characteristics simultaneously in each aspect has been desired.

SUMMARY OF THE INVENTION

The present invention is made in consideration of the above-stated problems, and an object of the present invention is to provide an electronic device with high reliability including a capacitor element in which low leak current for a long period of time can be attained and various characteristics can be improved simultaneously while realizing further large capacity in a capacitor element including a capacitor film composed of a dielectric material having a perovskite structure of $ABO_3$, and a manufacturing method thereof.

An electronic device according to the present invention includes: a substrate; and a capacitor element sandwiching a capacitor film by a lower electrode and an upper electrode at upward of the substrate, and wherein the capacitor film is composed of a dielectric material having a perovskite structure of $ABO_3$, and a crystal structure at an uppermost surface is a $BO_2$ termination surface.

An electronic device according to the present invention, includes: a substrate; and a capacitor element sandwiching a capacitor film by a lower electrode and an upper electrode at upward of the substrate, and wherein the capacitor film is composed of a dielectric material containing at least strontium (Sr) and oxygen (O), and contains Sr(I) and Sr(II) which are Sr (strontium) in two kind of states of which binding energies are different at a surface layer portion at a region of which depth is within 5 nm from a surface, and wherein an average concentration of Sr(I) at the surface layer portion is set as AC(I), an average concentration of Sr(II) at the surface layer portion is set as AC(II), and when R=AC(II)/AC(I), "0" (zero)$<R\leq 0.3$.

A manufacturing method of an electronic device including a substrate, and a capacitor element constituted by sandwiching a capacitor film by a lower electrode and an upper electrode at upward of the substrate, includes: depositing a dielectric material having a perovskite structure of $ABO_3$ on the lower electrode; and controlling a state of an uppermost surface of the deposited dielectric material so that a crystal structure at the uppermost surface becomes a $BO_2$ termination surface, when the capacitor film is formed.

A manufacturing method of an electronic device according to the present invention including a substrate, and a capacitor element constituted by sandwiching a capacitor film by a lower electrode and an upper electrode at upward of the substrate, includes: depositing a dielectric material containing at least strontium (Sr) and oxygen (O) on the lower electrode, and controlling a state of a surface layer portion so that Sr(I) and Sr(II) which are Sr (strontium) in two kinds of states of which binding energies are different are contained at the surface layer portion at a region of which depth is within 5 nm from a surface of the deposited dielectric material, and an average concentration of Sr(I) at the surface layer portion is set as AC(I), an average concentration of Sr(II) at the surface layer portion is set as AC(II), and when R=AC(II)/AC(I), "0" (zero)$<R\leq 0.3$, when the capacitor film is formed.

DETAILED DESCRIPTION OF THE PREFERRED EMBODIMENTS

Basic Gist of Present Invention

At first, the present inventor adopts a dielectric material having a perovskite structure of $ABO_3$ and at least containing Sr (strontium) at A site as the dielectric material of a capacitor film in a capacitor of a capacitor element, and focuses on a surface state of the capacitor film, so as to enable attaining low leak current for a long period of time while assuming to realize further large capacity.

Figure 1:
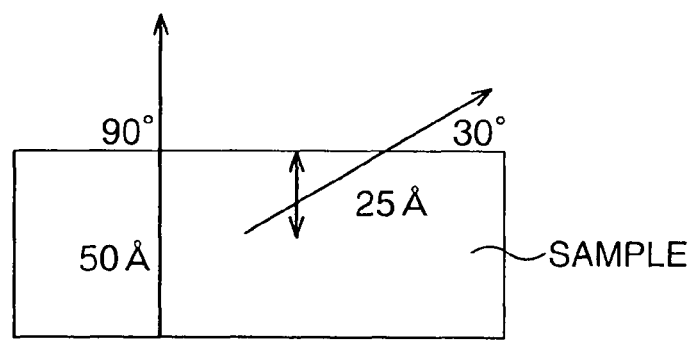
FIG. 1 is a schematic view to explain an analysis method by an X-ray photoelectron spectroscopic analyzer (ARXPS: Angle Resolved XPS) in which a scattering angle is made variable.

As a method to investigate the surface state of the capacitor film, an X-ray photoelectron spectroscopic analyzer (ARXPS: Angle Resolved XPS) in which a scattering angle is made variable is used. In this ARXPS, emitted photoelectrons are detected by adjusting the scattering angle variously as shown in FIG. 1. In the ARXPS, it is possible to control a depth of a portion where the photoelectrons are emitted by adjusting the scattering angle. For example, when a BST thin-film is used as a sample, the depth of the portion where the photoelectrons are emitted is approximately 1.5 nm when the scattering angle is adjusted to be 30 degrees, and the depth of the portion where the photoelectrons are emitted is approximately 3.0 nm when the scattering angle is adjusted to be 90 degrees. It becomes possible to detect a chemical state and a concentration of Ba (barium), Sr (strontium), Ti (titanium) being cations at a surface layer portion of the BST thin film being the sample, by a measurement using this ARXPS.

Figure 2:
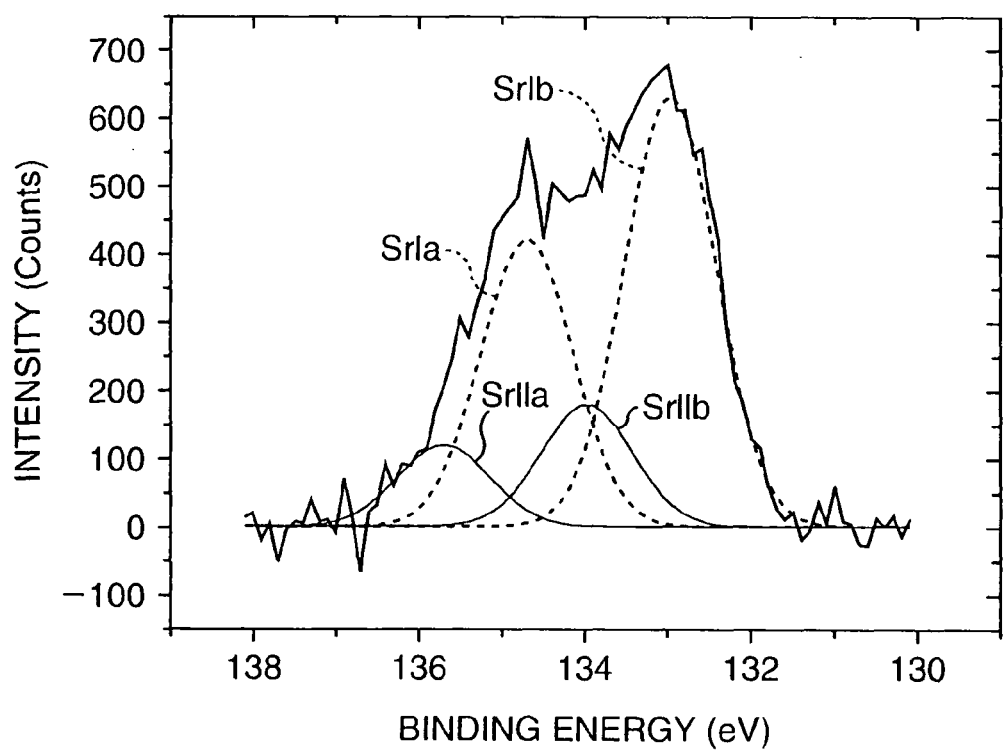
FIG. 2 is a characteristic chart showing a result of investigation of a surface state of a BST thin film by the ARXPS.

A result of the investigation of the surface state of the BST thin film by using the ARXPS is shown in FIG. 2. In FIG. 2, the scattering angle is adjusted (concretely, 10 degrees) so that the depth of the portion where the photoelectrons are emitted is to be within 5 nm, here, to be within 2.5 nm.

As shown in the drawing, a spectrum of a 3d orbit of Sr (Sr3d spectrum) can be obtained. In detail, it is verified that Sr in two kinds of chemical states having different binding energies exist at the surface layer portion of the BST thin film. Hereinafter, these chemical states are called as Sr(I) and Sr(II).

In detail, spin-orbit separations at the binding energies of approximately 133 eV (SrIb) and approximately 135 eV (SrIa) corresponding to Sr(I) occur resulting from a perovskite structure of Sr. On the other hand, it can be seen that the spin-orbit separations exist at the binding energies of approximately 134 eV (SrIIb) and approximately 136 eV (SrIIa), which are higher values than Sr(I), corresponding to Sr(II).

In the present invention, various characteristics in the capacitor element are improved simultaneously by using a fact that it is possible to mix both chemical states of Sr(I) and Sr(II) at the surface layer portion in a thin film such as STO and BST.

Figure 3:
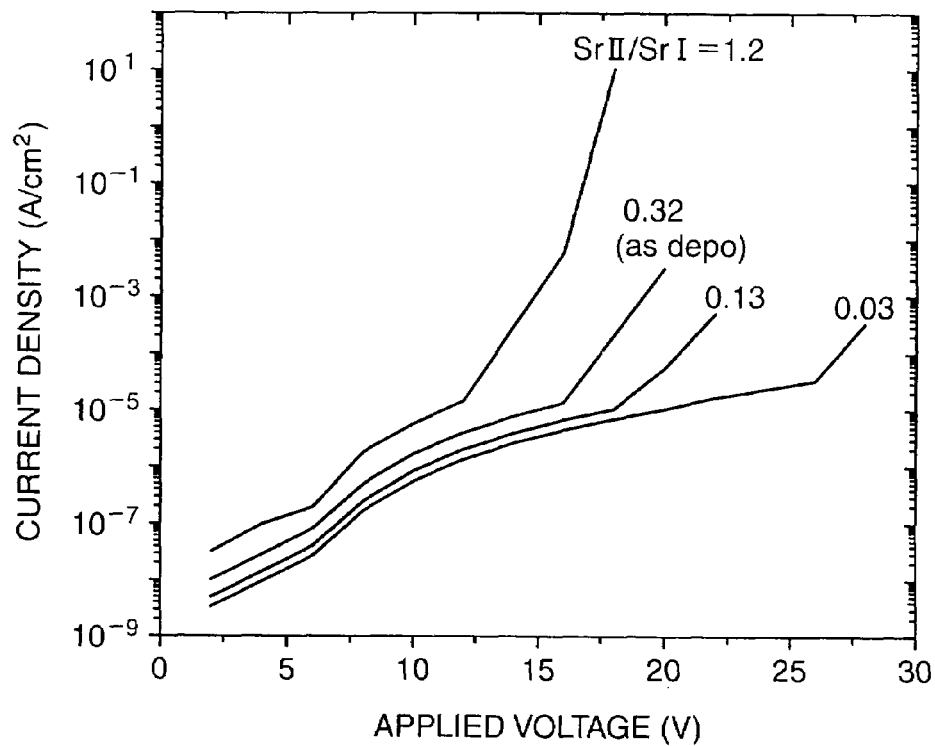
FIG. 3 is a characteristic chart showing a relation between an applied voltage and a current density when an existing ratio of Sr(I) and Sr(II) at a surface layer portion of the BST thin film being a capacitor film is changed in a capacitor element.

FIG. 3 is a characteristic chart showing a relation between an applied voltage and a current density when an existing ratio of Sr(I) and Sr(II) at the surface layer portion of the BST thin film being the capacitor film is changed, in the capacitor element.

In this drawing, the existing ratio of Sr(I) and Sr(II) is set as an R value defined by the following expression (1), in which an average concentration of Sr(I) is set as AC(I), and an average concentration of Sr(II) is set as AC(II) at a region of which depth from the surface of the BST thin film is within 5 nm, here, the portion up to 2.5 nm (the surface layer portion of which thickness is 2.5 nm).

$$R=AC(II)/AC(I) \quad (1)$$

As shown in FIG. 3, when "R=0.32" or less, an obvious improvement result of leak current can be seen compared to a case when "R=1.2", and it turns out that the leak current drastically decreases when "R=0.13" and "R=0.03". In the present invention, the value of "R" is proposed to be in a range as stated below in consideration of an error and so on of the "R" value.

"0" (zero)<R≦0.3, more preferably, "0" (zero)<R≦0.1

Here, it is desirable that a difference between the binding energy of Sr(II) and the binding energy of Sr(I) is a value within a range of 0.7 eV to 1.3 eV.

It is effective to sequentially perform processes of the following (1) to (3) to control the "R" value as stated above.

(1) A capacitor film (for example, an STO thin film, a BST thin film, or the like) is immersed in water for approximately one minute.

(2) The capacitor film is immersed in nitric acid for a predetermined time.

(3) The capacitor film is put under, for example, an oxygen ($O_2$) atmosphere of 1 atm, and an annealing process is performed at a temperature within a range of 100° C. to 900° C., preferably, 300° C. to 850° C. (for example, at approximately 450° C.) for approximately one hour.

Figure 4:
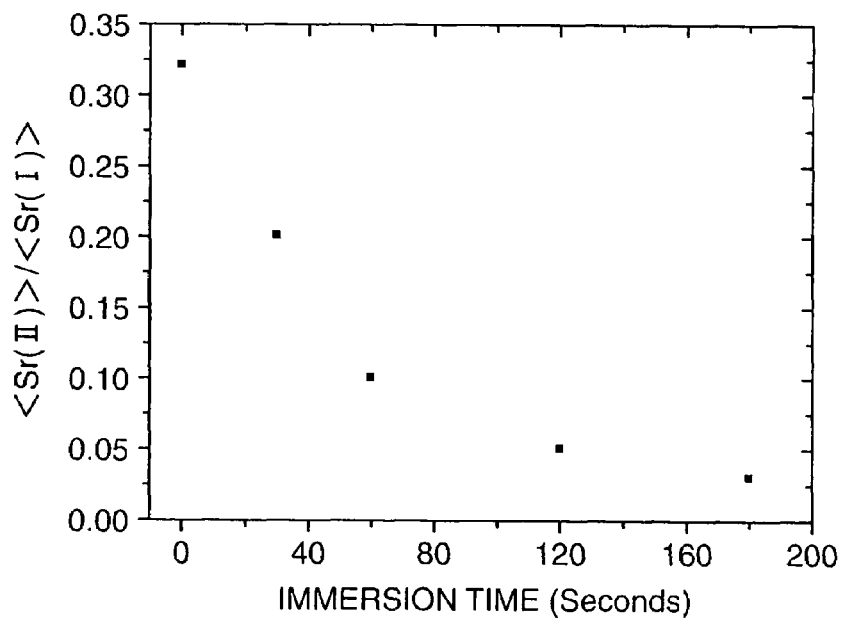
FIG. 4 is a characteristic chart showing a relation between a nitric acid immersion time and an R value in a process of (2) when a method from (1) to (3) in the present invention is used.

When the above-stated method of (1) to (3) is used, a relation between the nitric acid immersion time and the "R" value in the process of (2) is investigated. The result of experiment is shown in FIG. 4.

As shown in the drawing, "R=0.3" can be obtained by setting the nitric acid immersion time to be for approximately five seconds, the "R" value decreases little by little by extending the nitric acid immersion time, and "R=0.03" is attained by setting the nitric acid immersion time to be for approximately 180 seconds.

Further, the present inventor went through an investigation so as to generalize the above-stated result into a dielectric material having a perovskite structure represented by $ABO_3$. As a result, the inventor thought out that a main factor enabling simultaneous improvement of capacitor characteristics such as a voltage variability of a capacitor value and a leak current characteristic together with further large capacity exists in a crystal structure at an uppermost surface of the capacitor film.

In the capacitor element including the capacitor film composed of the dielectric material having the perovskite structure, there is a deterioration of the capacitor film caused by moisture as the main cause deteriorating the capacitor characteristics. In particular, penetration of moisture at a surface layer (a surface layer of the capacitor film at an upper electrode side) is fatal for the capacitor characteristics in a thin capacitor film of which thickness is, for example, approximately 1 nm to 1000 nm.

Figure 5:
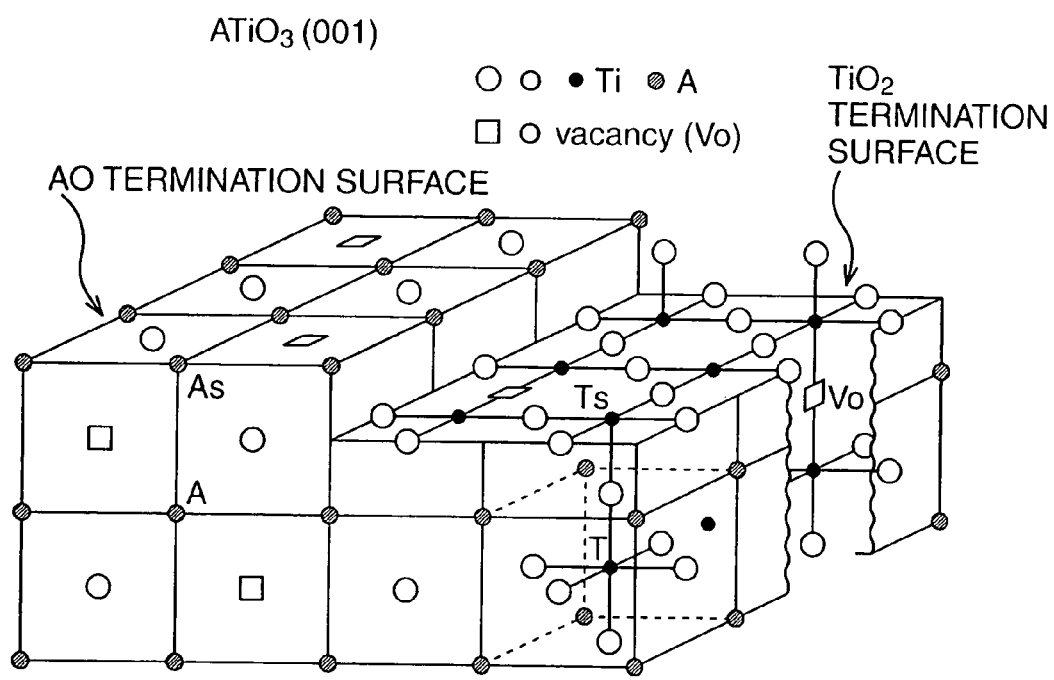
FIG. 5 is a schematic view showing an appearance of an uppermost surface of a dielectric film having a perovskite structure represented by $ABO_3$.

The uppermost surface of a dielectric film having the perovskite structure represented by $ABO_3$ may have two kinds of states, that is a state of the uppermost surface terminating at AO (AO termination surface) and a state of the uppermost surface terminating at $BO_2$ ($BO_2$ termination surface), as shown in FIG. 5. Generally, the dielectric material just after a deposition (as depo) takes a mode in which both states are mixed. These two kinds of states can be identified by the above-stated ARXPS.

Here, a case when (Ba, Sr)$TiO_3$ (BST) is used as the dielectric material is exemplified.

Figure 6:
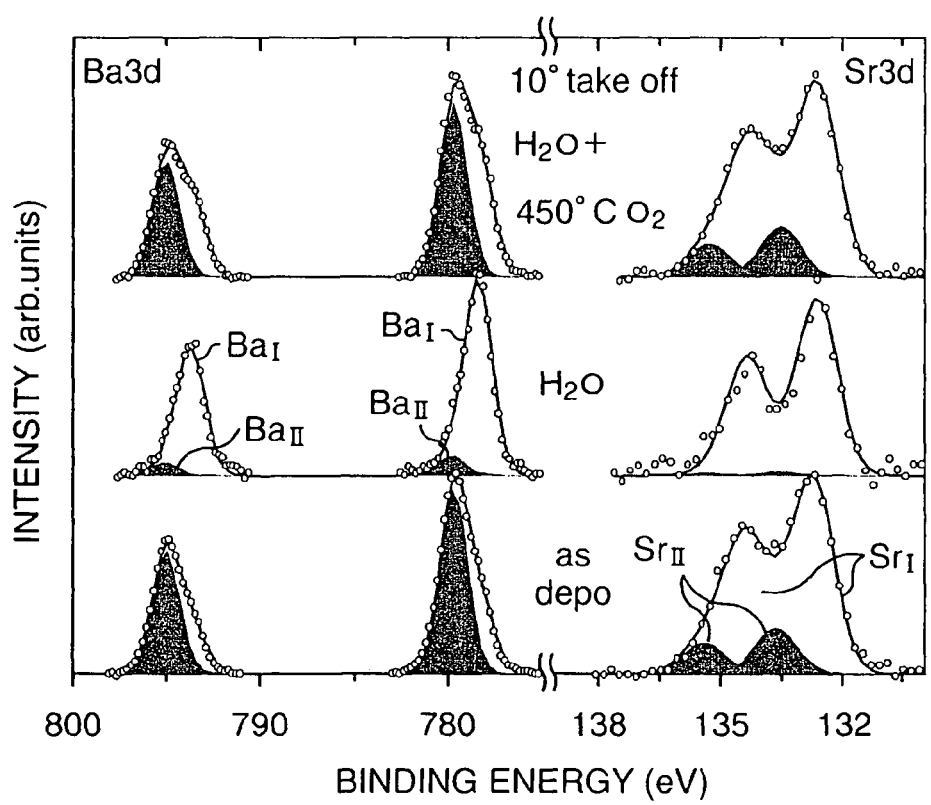
FIG. 6 is a characteristic chart showing a spectrum of a 3d orbit of Ba (Ba3d spectrum), and a spectrum of a 3d orbit of Sr (Sr3d spectrum) when a scattering angle is adjusted to be 10 degrees in the BST.

A spectrum of a 3d orbit of Ba (Ba3d spectrum) and a spectrum of a 3d orbit of Sr (Sr3d spectrum) when a scattering angle is adjusted to be 10 degrees in the BST are shown in FIG. 6.

In the Ba3d spectrum and Sr3d spectrum, Ba and Sr in low binding energy states showing two kinds of spin orbits of which peak positions are respectively different (Ba(I), Sr(I)) are identified. Ba(I), Sr(I) are equivalent to states in which twelve oxygen atoms (O) are coordinated to Ba and Sr in a perovskite phase, and represents a state of Ba and Sr when the $BO_2$ termination surface (here, $TiO_2$ (titanium oxide) termination surface) is formed. On the other hand, Ba and Sr (Ba(II), Sr(II)) in higher binding energy states than Ba(I) and Sr(I) represent states of Ba and Sr when the AO termination surface is formed.

Water treatment is performed to the dielectric film, and then, almost all of Ba(II), Sr(II) disappear, and it is conceivable that a chemical reaction occurs between Ba and Sr of the AO termination surface and water ($H_2O$). Further, when the annealing process is performed to the dielectric film at 450° C. under the oxygen atmosphere after the water treatment, Ba(II), Sr(II) become large again, owing to water desorbing from the film surface, and a mixed state of Ba(II), Sr(II) and Ba(I), Sr(I) is recognized. This demonstrates the AO termination surface is largely affected by the moisture.

Figure 7:
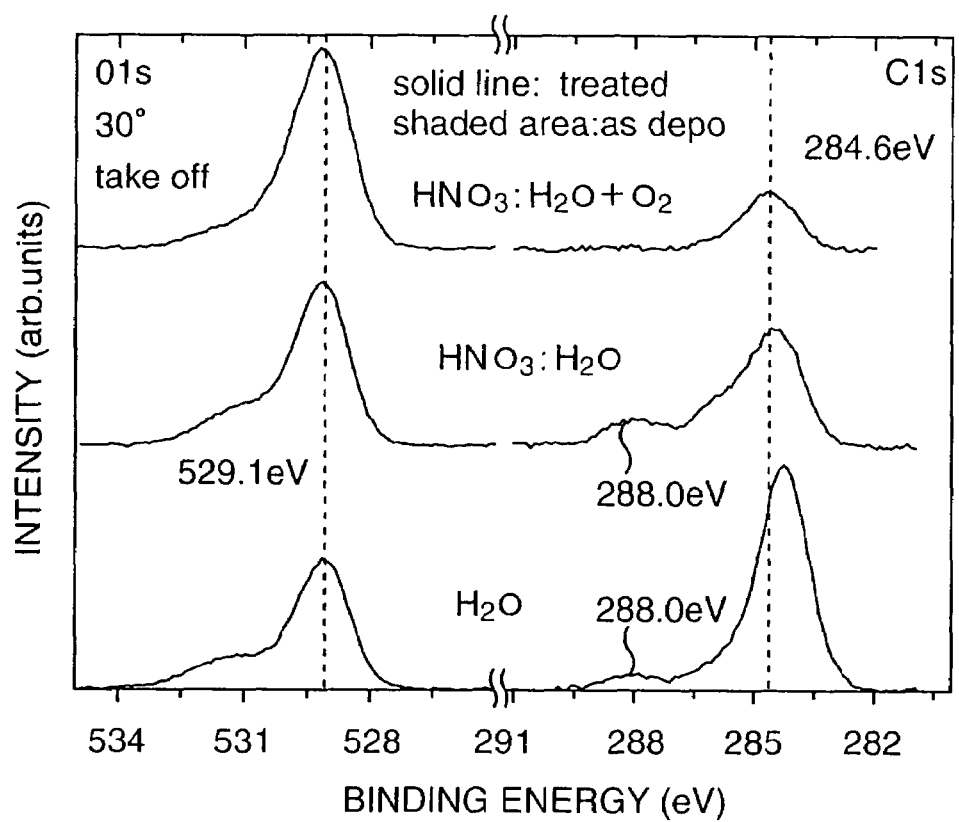
FIG. 7 is a characteristic chart showing a spectrum of a 1s orbit of carbon (C) (C1s spectrum) and a spectrum of a 1s orbit of oxygen (O) (O1s spectrum) by the ARXPS when the scattering angle is adjusted to be 30 degrees.

A spectrum of a 1s orbit of carbon (C) (C1s spectrum) and a spectrum of a 1s orbit of oxygen (O) (O1s spectrum) by the ARXPS when the scattering angle is adjusted to be 30 degrees are shown in FIG. 7.

In FIG. 7, a state when the binding energy in the O1s spectrum is 531 eV and a state when the binding energy in the C1s spectrum is 288 eV show modes of hydroxyl group and/or chemisorbed carbonate or carbonate of Ba and Sr.

Figure 8:
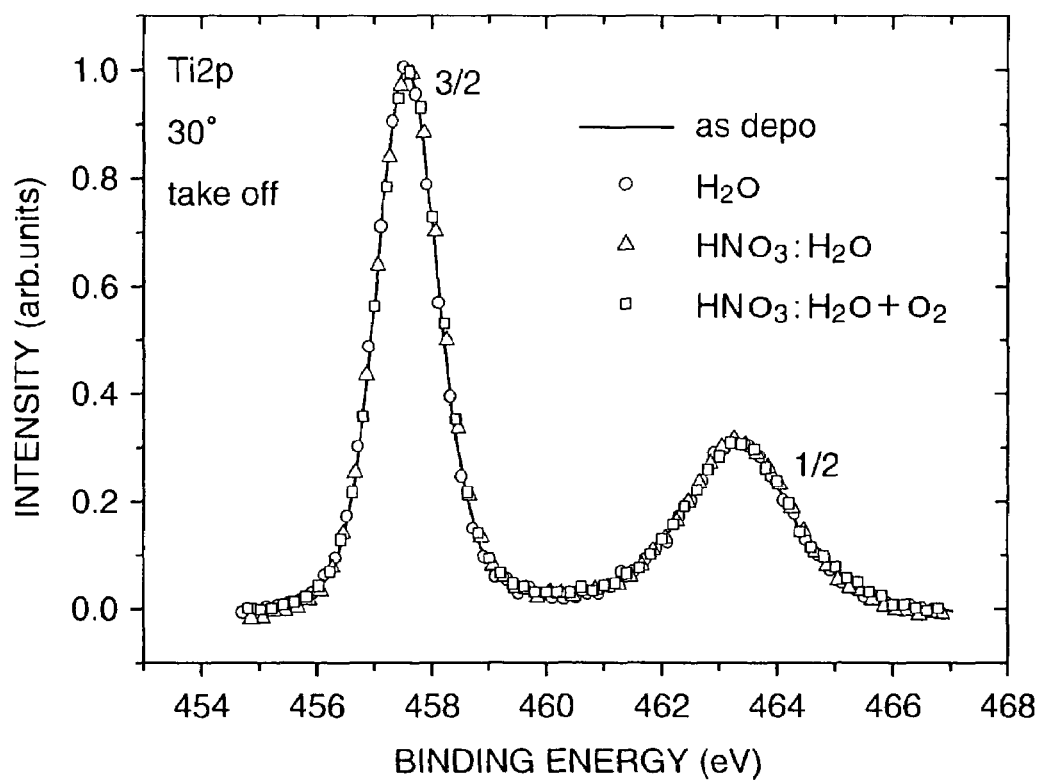
FIG. 8 is a characteristic chart showing a spectrum of a 2p orbit of Ti (Ti2p spectrum) at a $TiO_2$ termination surface by the ARXPS when the scattering angle is adjusted to be 30 degrees.

A spectrum of a 2p orbit of Ti (Ti2p spectrum) at the $TiO_2$ termination surface by the ARXPS when the scattering angle is adjusted to be 30 degrees is shown in FIG. 8.

As shown in the drawing, there is no change in the Ti2p spectrum in respective cases when the water treatment is performed, when a nitrate treatment and water treatment are performed, and when the annealing process is performed at 450° C. in the oxygen atmosphere after the nitrate treatment and water treatment are performed, just after the deposition of the dielectric material. It can be seen that the dielectric film of which uppermost surface is the $TiO_2$ termination surface is not affected by the water treatment. Namely, it can be seen that the chemical state relative to moisture is extremely stable at the dielectric film of which uppermost surface is the $TiO_2$ termination surface, though the dielectric film of which uppermost surface is AO termination surface is affected by the moisture largely.

As it can be seen from the above, the capacitor film of which crystal structure at the uppermost surface is the $BO_2$ termination surface is proposed, in the capacitor film having the perovskite structure such as STO and BST, in the present invention. This is generalizing the above-stated discussion using so-called the "R" value, and as an idealized state, it is conceivable that R="0" (zero) corresponds to a case when all over the uppermost surface of the capacitor film is the $BO_2$ termination surface. As stated above, it becomes possible to suppress the deterioration of the capacitor film caused by the moisture and to realize an electronic device with high reliability, including a capacitor element enabling to realize the large capacity and to attain the low leak current for a long period of time, and capable of improving various characteristics simultaneously, by controlling the ratio of the $BO_2$ termination surface relative to the AO termination surface at all over the uppermost surface to be large as much as possible.

It is effective to perform the processes of the following (1), (2) sequentially to control the uppermost surface of the capacitor film as stated above. It is possible to enlarge the ratio of the $BO_2$ termination surface at the uppermost surface as much as possible by performing the processes.

(1) The capacitor film (for example, STO thin film, BST thin film, or the like) is chemical cleaned by, for example, hydrofluoric acid (HF) buffer solution.
(2) The annealing process is performed to the BST thin film at a temperature in a range of 100° C. to 900° C., preferably, 300° C. to 850° C. (for example, at approximately 450° C.) for, for example, approximately one hour under, for example, the oxygen ($O_2$) atmosphere of 1 atm.

Concrete Embodiments Applying the Present Invention

In consideration of the above-stated basic gist of the present invention, concrete embodiments applying the present invention are described. In the following respective embodiments, a semiconductor memory including so-called stacked type capacitor elements (a structure in which electrical connections are respectively established at downward of a lower electrode and upward of an upper electrode in the capacitor element) to constitute respective memory cells, and constituted by disposing plural memory cells in, for example, a matrix state, is exemplified as an electronic device. In the following respective embodiments, the constitution of the memory cell of the semiconductor memory is described together with a manufacturing method thereof for convenience of explanation.

First Embodiment

FIG. 9A to FIG. 13 are schematic sectional views showing a manufacturing method of a stacked type semiconductor memory according to a first embodiment in process sequence.

Figure 9A:
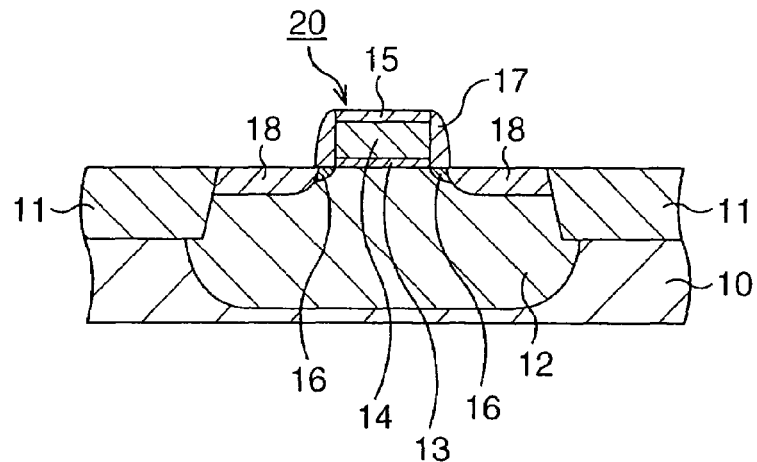
FIG. 9A, FIG. 9B, and FIG. 9C are schematic sectional views showing a manufacturing method of a stacked type semiconductor memory according to a first embodiment in process sequence.

At first, as shown in FIG. 9A, a MOS transistor 20 functioning as a selection transistor is formed on a silicon semiconductor substrate 10.

In detail, element isolation structures 11 are formed by, for example, an STI (Shallow Trench Isolation) method at a surface layer of the silicon semiconductor substrate 10 to settle an element active region. Here, a Ge (germanium) substrate, SiGe (silicon germanium) substrate, GaAs (gallium arsenic) substrate, InAs (indium arsenic) substrate, InP (indium phosphorus) substrate, or the other III/V group compound semiconductor substrates may be used instead of the silicon semiconductor substrate. Besides, an Si (silicon) layer, Ge layer, SiGe layer, GaAs layer, InAs layer, InP layer, or the other III/V group compound semiconductor layers may be formed on a predetermined substrate (for example, an insulating substrate), instead of the silicon semiconductor substrate.

Next, an impurity, here, for example, boron ($B^+$) being a P-type impurity is ion implanted into the element active region under a condition of, for example, a dose amount of $3.0 \times 10^{13}/cm^2$ an acceleration energy of 300 keV, to form a well 12.

Next, a thin gate insulating film 13 with film thickness of approximately 3.0 nm is formed at the element active region by thermal oxidation and so on, a polycrystalline silicon film with film thickness of approximately 180 nm and, for example, a silicon nitride film with film thickness of approximately 29 nm are deposited on the gate insulating film 13 by a CVD method, and a gate electrode 14 is pattern formed on the gate insulating film 13 by processing the silicon nitride film, the polycrystalline silicon film, and the gate insulating film 13 into an electrode shape by a lithography and a subsequent dry etching. At this time, a cap film 15 composed of a silicon nitride film is simultaneously pattern formed on the gate electrode 14.

Next, an impurity, here, arsenic ($As^+$) being an N-type impurity is ion implanted into the element active region under a condition of, for example, a dose amount of $5.0 \times 10^{14}/cm^2$, an acceleration energy of 10 keV while using the cap film 15 as a mask, to form so-called LDD regions 16.

Next, for example, a silicon oxide film is deposited on a whole surface by the CVD method, and sidewall insulating films 17 are formed while remaining the silicon oxide film only at side surfaces of the gate electrode 14 and the cap film 15 by performing so-called an etching back of this silicon oxide film.

Next, an impurity, here, phosphorus ($P^+$) being the N-type impurity is ion implanted into the element active region under a condition such that an impurity concentration becomes higher than the LDD region 16 while using the cap film 15 and the sidewall insulating films 17 as the masks, to form source/drain regions 18 overlapping with the LDD regions 16, to complete the MOS transistor 20.

Figure 9B:
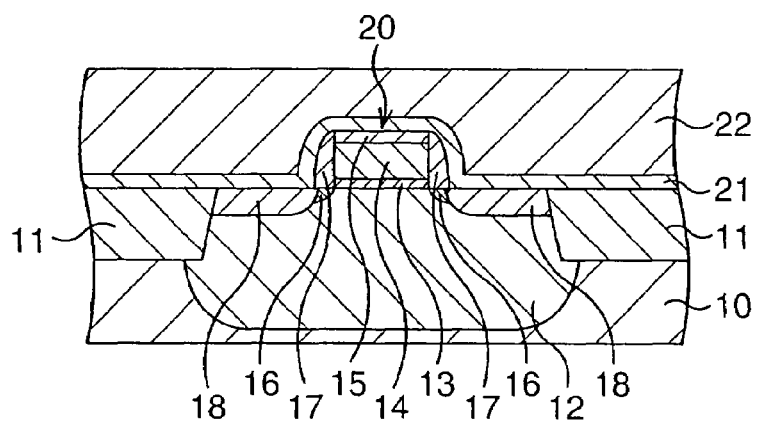

Subsequently, a protective film 21 of the MOS transistor 20, and an interlayer insulating film 22 are sequentially formed as shown in FIG. 9B.

In detail, the protective film 21 and the interlayer insulating film 22 are sequentially formed so as to cover the MOS transistor 20. Here, a silicon nitride film is used as a material, and it is deposited for film thickness of approximately 130 nm by the CVD method as the protective film 21. As the interlayer insulating film 22, for example, a plasma TEOS film (film thickness of approximately 1300 nm) is formed, and it is polished until the film thickness becomes approximately 700 nm by a CMP.

Figure 9C:
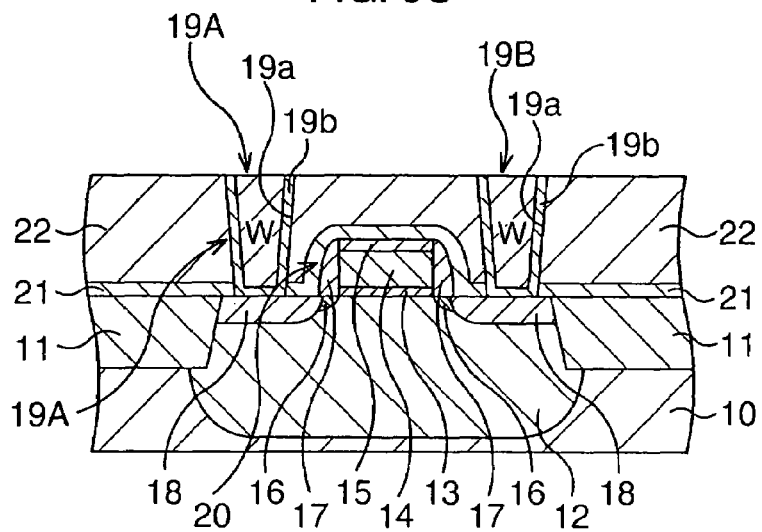

Subsequently, conductive plugs 19A, 19B connected to the source/drain regions 18 of the MOS transistor 20 are formed as shown in FIG. 9C.

In detail, at first, the interlayer insulating film 22 and the protective film 21 are processed by the lithography and the subsequent dry etching until parts of surfaces of the respective source/drain regions 18 expose while using the respective source/drain regions 18 as an etching stopper, and via holes 19a with a diameter of, for example, approximately 0.3 μm are respectively formed.

Next, for example, a Ti film and TiN (titanium nitrogen) film are sequentially deposited for film thickness of approximately 20 nm and for film thickness of approximately 50 nm by a sputtering method so as to cover wall surfaces of the respective via holes 19a, to form base films (glue film) 19b. Then, for example, W (tungsten) films are deposited so as to embed the respective via holes 19a via the glue films 19b by the CVD method. After that, the W films and the glue films 19b are polished by the CMP while using the interlayer insulating film 22 as a polishing stopper, and the respective conductive plugs 19A, 19B, embedding inside of the respective via holes 19a with W via the glue films 19b, are simultaneously formed. After the CMP, for example, a plasma annealing process of $N_2O$ (nitrogen oxide) is performed.

Figure 10A:
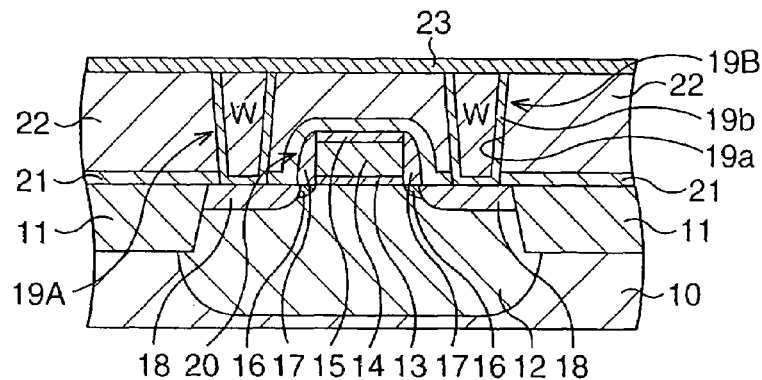
FIG. 10A, FIG. 10B, and FIG. 10C are schematic sectional views showing the manufacturing method of the stacked type semiconductor memory according to the first embodiment in process sequence followed by FIG. 9C.

Subsequently, a conductive base film 23 is formed as shown in FIG. 10A.

In detail, the conductive base film 23 to be an adhesive layer of the lower electrode in a later-described capacitor element is formed. As a material of the conductive base film 23, one kind selected from a first group of Pt (platinum), Ir (iridium), Zr (zirconium), Ti or an alloy of at least two kinds selected from the first group, one kind selected from a second group of $TiO_x$ (titanium oxide), $IrO_x$ (iridium oxide), $PtO_x$ (platinum oxide), $ZrO_x$ (zirconium oxide) ("0" (zero)$<x \leq 2$) or a stacked structure of at least two kinds of oxides selected from the second group, one kind selected from a third group of TiN, TiAlN (titanium aluminum nitrogen), TaN (tantalum nitrogen), TaSiN (tantalum silicon nitrogen) or a stacked structure of at least two kinds of oxides selected from the third group, or a stacked structure and so on accordingly selected from among the one kind selected from the first group or the alloy of at least the two kinds selected from the first group, the one kind selected from the second group or the stacked structure of at least the two kinds of oxides selected from the second group, and the one kind selected from the third group or the stacked structure of at least the two kinds of oxides selected from the third group, are suitable. In the present embodiment, $TiO_2$ is used as the material, and it is deposited for the film thickness of approximately 50 nm by, for example, an RF magnetron sputtering method to form the conductive base film 23.

Figure 10B:
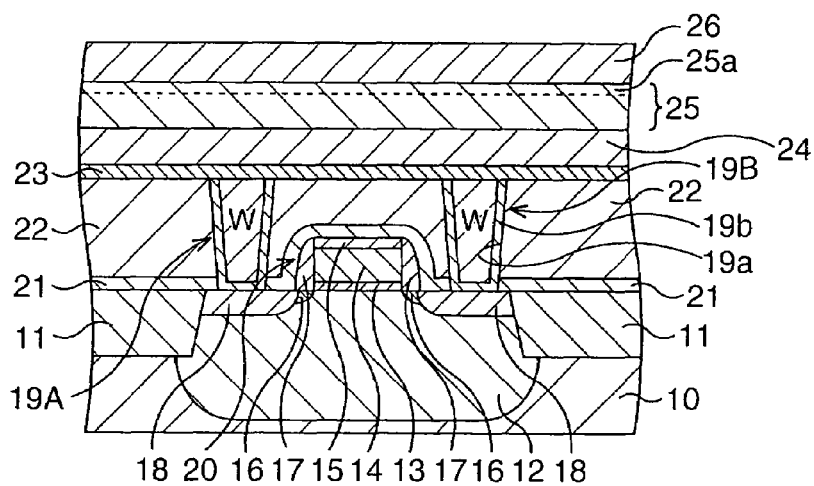

Subsequently, a lower electrode film 24, a capacitor film 25, and an upper electrode film 26 are sequentially formed as shown in FIG. 10B.

In detail, at first, the lower electrode film 24 to be the later-described lower electrode is formed on the conductive base film 23. As a material of the lower electrode film 24, one kind selected from a first group of Pt, Pd (palladium), Ir, Ru (ruthenium) Rh (rhodium), Re (rhenium), Os (osmium), Au (gold), Ag (silver), Cu (cuprum) or an alloy of at least two kinds selected from the first group, one kind selected from a second group of $PtO_x$, $IrO_x$, $RuO_x$ (ruthenium oxide) ("0" (zero)$<x \leqq 2$) or a stacked structure of at least two kinds of oxides selected from the second group, or a stacked structure of the one kind selected from the first group or the alloy of at least the two kinds selected from the first group and the one kind selected from the second group or the stacked structure of at least the two kinds of oxides selected from the second group, is suitable. In the present embodiment, Pt is used as the material, and it is deposited for the film thickness of approximately 100 nm by, for example, the RF magnetron sputtering method, to form the lower electrode film 24.

Subsequently, the capacitor film 25 being a dielectric film is formed on the lower electrode film 24.

As a material of the capacitor film 25, a dielectric material having a perovskite structure of $ABO_3$, for example, one kind selected from $SrTiO_3$ (STO) (Ba, Sr)$TiO_3$ (BST), $SrZrO_3$ (strontium zirconium oxide), (Ba, Sr)(Zr, Ti)$O_3$, and so on is suitable.

In the present embodiment, at first, for example, BST, here, $Ba_{0.7}Sr_{0.3}TiO_3$ is used as the material, and it is deposited for the film thickness of approximately 100 nm by, for example, the RF magnetron sputtering method, to form the BST thin film.

Next, the silicon semiconductor substrate 10 on which the BST thin film is formed is immersed in water for approximately one minute.

Next, the silicon semiconductor substrate 10 on which the BST thin film is formed is immersed in nitric acid ($HNO_3$) for a predetermined time, here for approximately 180 seconds.

The annealing process is then performed to the BST thin film, for example, at approximately 450° C. for approximately one hour under, for example, the oxygen ($O_2$) atmosphere of 1 atm.

According to the above-stated processes, the capacitor film 25 of which "R" value defined by the above-stated expression (1) is, for example, approximately 0.03, is formed at a surface layer portion 25a up to a depth of approximately 2.5 nm.

Subsequently, the upper electrode film 26 to be a later-described upper electrode is formed on the capacitor film 25.

As a material of the upper electrode film 26, one kind selected from a first group of Pt, Pd, Ir, Ru, Rh, Re, Os, Au, Ag, Cu or an alloy of at least two kinds selected from the first group, one kind selected from a second group of $PtO_x$, $IrO_x$, $RuO_x$ ("0" (zero)$<x \leqq 2$), $SrRuO_3$ (strontium ruthenium oxide), $LaNiO_3$ (lanthanum nickel oxide) or a stacked structure of at least two kinds of oxides selected from the second group, or a stacked structure of the one kind selected from the first group or the alloy of at least two kinds selected from the first group and the one kind selected from the second group or the stacked structure of at least the two kinds of oxides selected from the second group, is suitable. In the present embodiment, Pt is used as the material, and it is deposited for the film thickness of approximately 100 nm by, for example, the RF magnetron sputtering method, to form the upper electrode film 26.

Figure 10C:
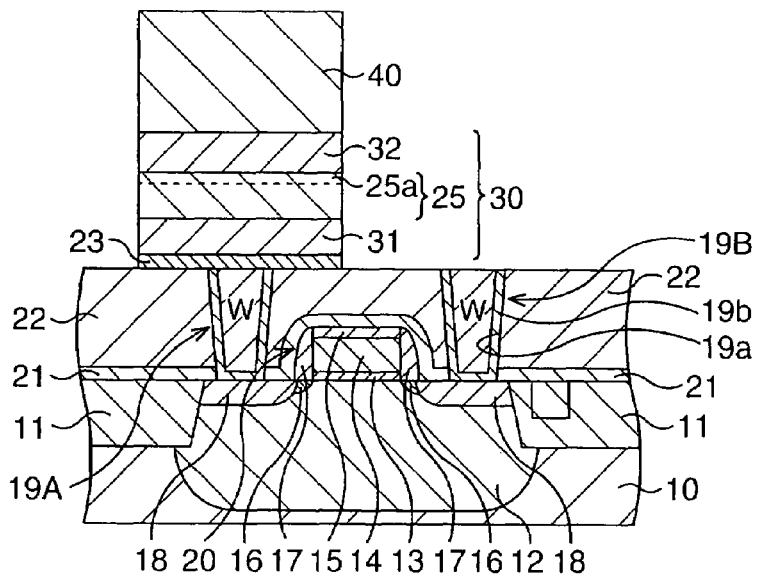

Subsequently, as shown in FIG. 10C, the upper electrode film 26, the capacitor film 25, the lower electrode film 24, and the conductive base film 23 are patterned to complete a capacitor element 30.

In detail, a resist pattern 40 is formed on the upper electrode film 26 by the lithography and a dry etching is performed to the upper electrode film 26, the capacitor film 25, the lower electrode film 24, and the conductive base film 23 while using this resist pattern 40 as a mask. The capacitor element 30 sandwiching the capacitor film 25 between a lower electrode 31 and an upper electrode 32, and constituted by electrically connecting the lower electrode 31 to the conductive plug 19A via the conductive base film 23, is pattern formed by this etching.

Figure 11A:
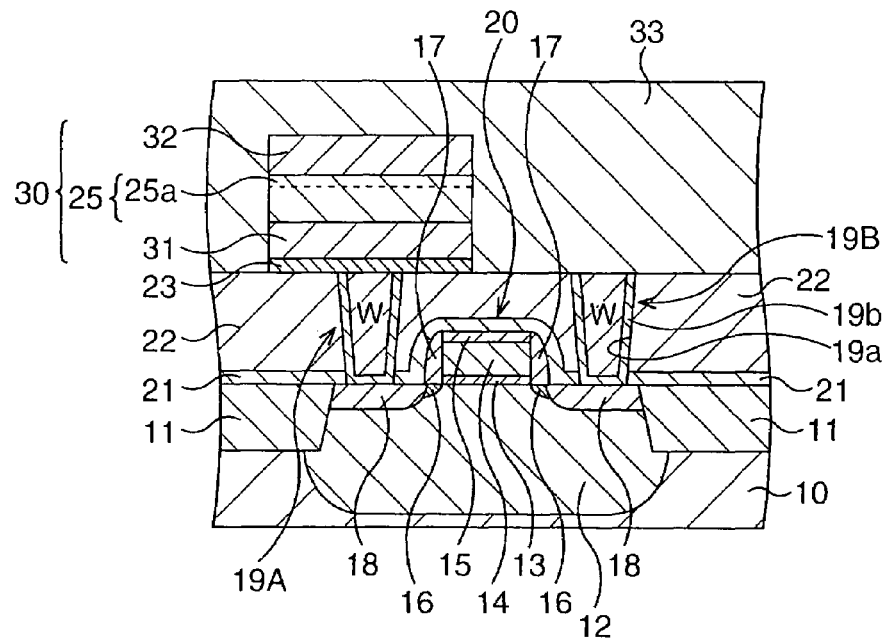
FIG. 11A and FIG. 11B are a schematic sectional views showing the manufacturing method of the stacked type semiconductor memory according to the first embodiment in process sequence followed by FIG. 10C.

Subsequently, an interlayer insulating film 33 is formed, as shown in FIG. 11A.

In detail, after the resist pattern 40 is removed by an ashing and so on, the interlayer insulating film 33 is formed so as to cover a whole surface of the capacitor element 30. Here, as the interlayer insulating film 33, for example, a silicon oxide film is deposited for the film thickness of approximately 1500 nm to 2500 nm by a plasma CVD method using TEOS, and thereafter, it is polished to form until the film thickness becomes, for example, approximately 1000 nm by the CMP. After the CMP, for example, a plasma annealing process of $N_2O$ is performed for dehydration of the interlayer insulating film 33.

Figure 11B:
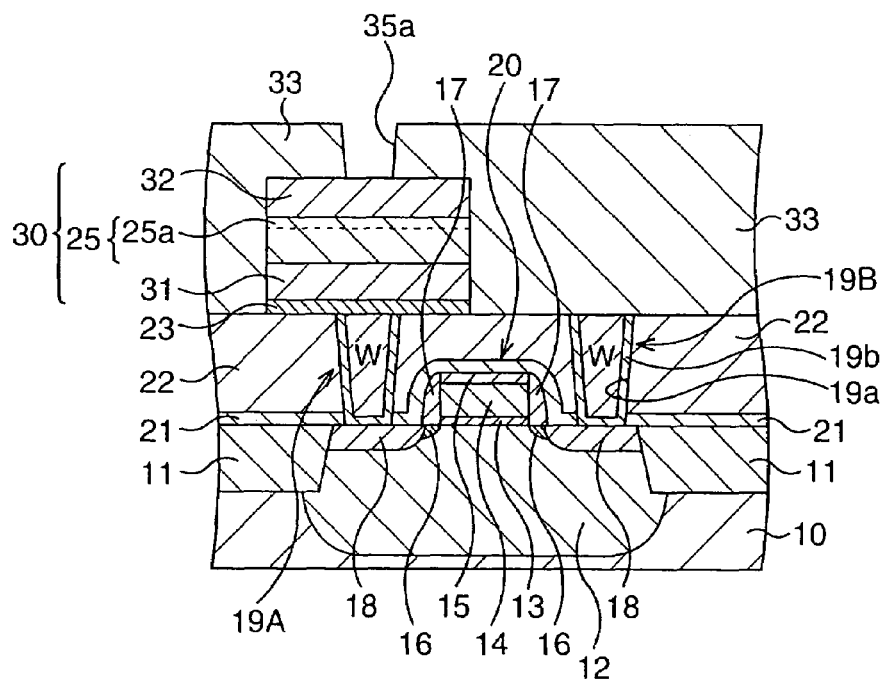

Subsequently, as shown in FIG. 11B, a via hole 35a to the upper electrode 32 of the capacitor element 30 is formed.

In detail, the interlayer insulating film 33 is patterned by the lithography and the subsequent dry etching, to form the via hole 35a exposing a part of a surface of the upper electrode 32.

Figure 12A:
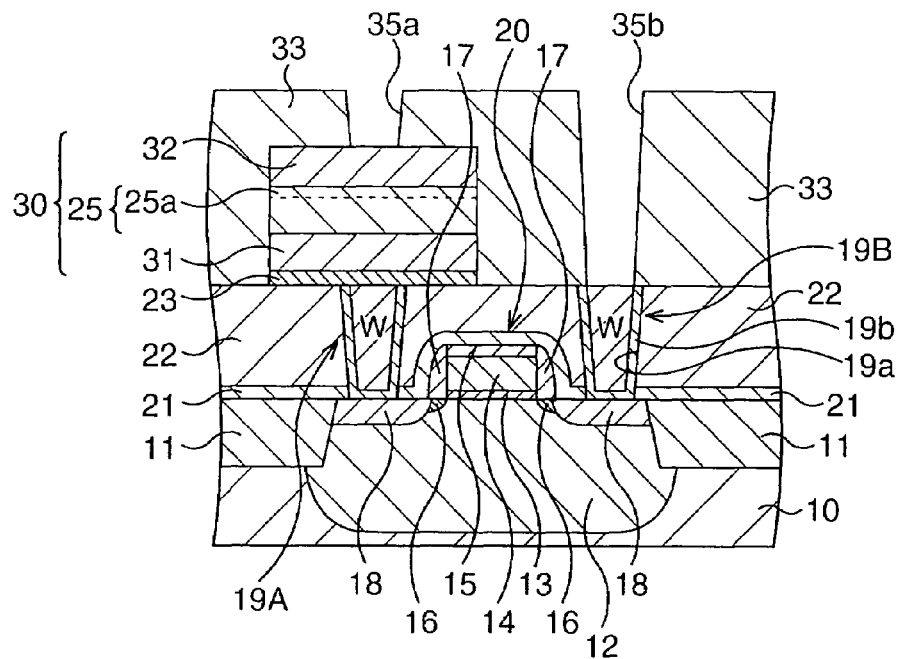
FIG. 12A and FIG. 12B are schematic sectional views showing the manufacturing method of the stacked type semiconductor memory according to the first embodiment in process sequence followed by FIG. 11B.

Subsequently, as shown in FIG. 12A, a via hole 35b to the conductive plug 19B is formed.

In detail, the interlayer insulating film 33 is patterned by the lithography and the subsequent dry etching, to form the via hole 35b exposing a part of a surface of the conductive plug 19B.

Figure 12B:
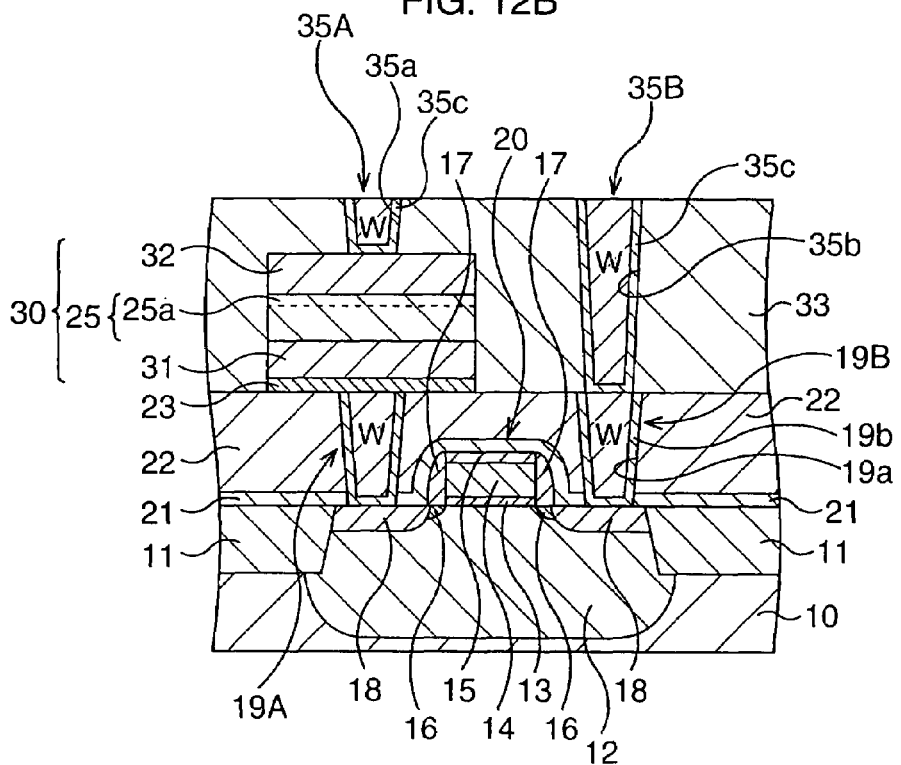

Subsequently, as shown in FIG. 12B, a conductive plug 35A connected to the upper electrode 32 of the capacitor element 30 and a conductive plug 35B connected to the conductive plug 19B are simultaneously formed.

In detail, at first, base films (glue film) 35c are formed so as to cover wall surfaces of the via holes 35a, 35b, and thereafter, the W films are formed so as to embed the via holes 35a, 35b via the glue films 35c by the CVD method. Next, for example, the W films and the glue films 35c are polished by the CMP while using the interlayer insulating film 33 as a stopper, to form the conductive plugs 35A, 35B embedding inside of the via holes 35a, 35b with W via the glue films 35c. After the CMP, for example, the plasma annealing process of $N_2O$ is performed.

Figure 13:
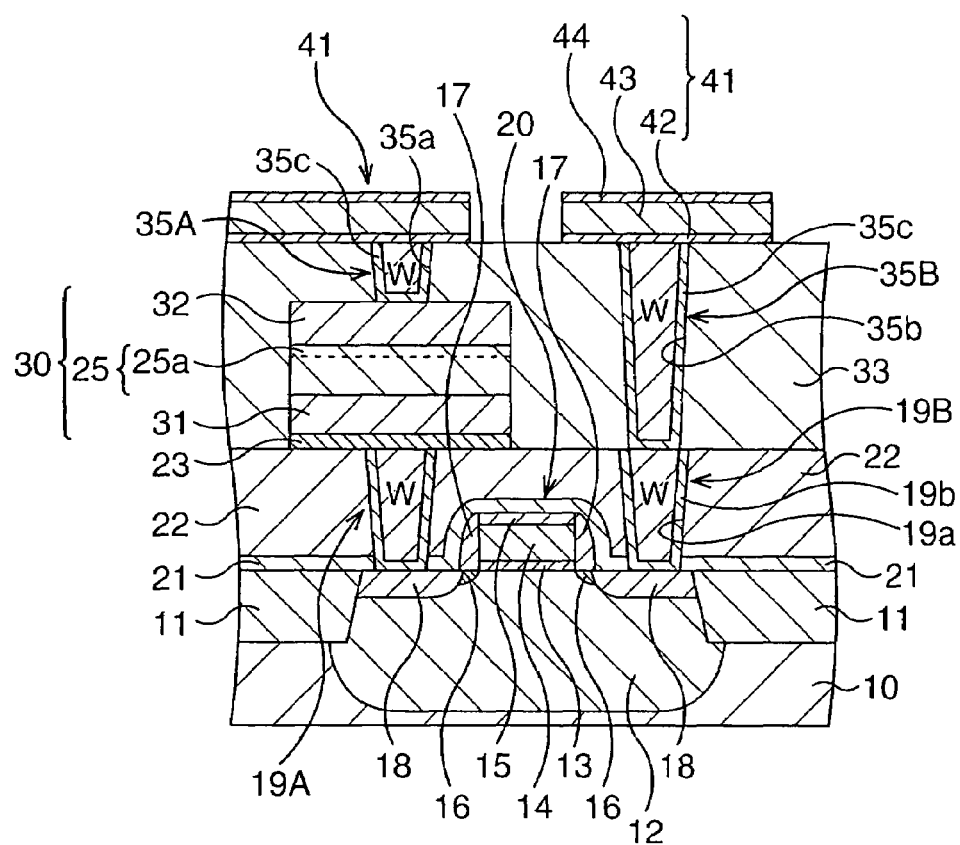
FIG. 13 is a schematic sectional view showing the manufacturing method of the stacked type semiconductor memory according to the first embodiment in process sequence followed by FIG. 12B.

Subsequently, as shown in FIG. 13, respective wirings 41 respectively connected to the conductive plugs 35A, 35B are formed.

In detail, at first, a barrier metal film 42, a wiring film 43, and a barrier metal film 44 are deposited on the whole surface of the interlayer insulating film 33 by the sputtering method and so on. As the barrier metal film 42, for example, a Ti film for film thickness of approximately 60 nm and a TiN film for film thickness of approximately 30 nm are stacked and film-formed by the sputtering method. As the wiring film 43, for example, an Al (aluminum) alloy film (here Al—Cu film) is film-formed for film thickness of approximately 400 nm. As the barrier metal film 44, for example, a Ti film for film thickness of approximately 5 nm and a TiN film for film thickness of approximately 70 nm are stacked and film-formed by the sputtering method.

Next, for example, an SiON (silicon oxide nitride) film or an antireflection film (not shown) is film-formed as an antireflection film, and thereafter, the antireflection film, the barrier metal film 44, the wiring film 43, and the barrier metal film 42 are processed into a wiring shape by the lithography and the subsequent dry etching, and the respective wirings 41 respectively connected to the conductive plugs 35A, 35B are pattern formed. Incidentally, a Cu film (or a Cu alloy film) may be formed by using so-called a damascene method and so on to form a Cu wiring as the wiring 41, instead of forming the Al alloy film as the wiring film 43.

After that, a stacked type semiconductor memory according to the present embodiment is completed via concrete processes such as formations of the interlayer insulating film, and further upper layer wirings.

Incidentally, the annealing process performed to the above-stated BST thin film may be performed to the BST thin film, for example, after the upper electrode film 26 is formed on the BST thin film, to form the capacitor film 25 under the upper electrode film 26. In this case, a temperature of the annealing process is desirable to be set at 700° C. or less when the upper electrode film 26 is composed of Pt, at 900° C. or less when it is composed of $IrO_2$, and at 400° C. or less when it is composed of Au, and therefore, it is good if the temperature is set at 450° C. as stated above.

As it is described hereinabove, according to the present embodiment, the capacitor film 25 of the capacitor element 30 is formed from the dielectric material having the perovskite structure containing at least Sr and O, here, from the BST thin film, and thereby, it becomes possible to attain the low leak current for a long period of time while realizing further large capacity, and it becomes possible to realize the semiconductor memory with high reliability including the capacitor element 30 capable of improving various characteristics simultaneously.

Second Embodiment

In the present embodiment, a capacitor film of the capacitor element 30 is formed as stated below. Incidentally, the other component members have a similar constitution with the first embodiment, and they are to be formed similarly.

FORMATION EXAMPLE 1

As a material of a capacitor film, a dielectric material having the perovskite structure of $ABO_3$, for example, one kind selected from $SrTiO_3$ (STO), (Ba, Sr)$TiO_3$ (BST), $SrZrO_3$, (Ba, Sr)(Zr, Ti)$O_3$ and so on, is suitable.

In the present embodiment, at first, a BST thin film is formed by using, for example, BST, here, $Ba_{0.7}Sr_{0.3}TiO_3$ as the material, and it is deposited for film thickness of approximately 100 nm by, for example, the RF magnetron sputtering method.

Next, the silicon semiconductor substrate 10 on which the BST thin film is formed is chemical cleaned by, for example, the hydrofluoric acid (HF) buffer solution.

The BST thin film is then put under, for example, the oxygen ($O_2$) atmosphere of 1 atm, and the annealing process is performed at, for example, approximately 450° C. for, for example, approximately one hour.

Figure 14:
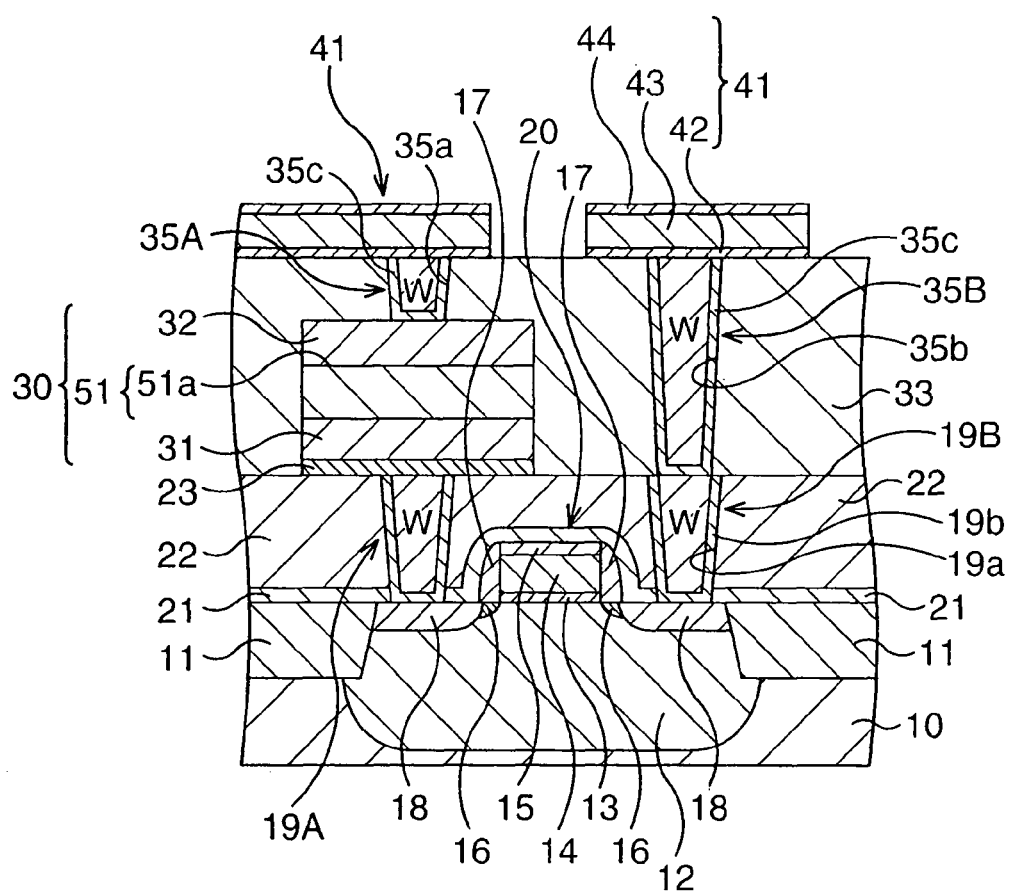
FIG. 14 is a schematic sectional view showing a stacked type semiconductor memory according to a formation example 1 of a second embodiment.

Accordingly, a capacitor film 51 in which a crystal structure at an uppermost surface 51a becomes a $TiO_2$ termination surface as much as possible (at the uppermost surface, a ratio of the $TiO_2$ termination surface relative to a (Ba, Sr)O termination surface is large as much as possible) is formed. An appearance of a semiconductor memory corresponding to FIG. 13 in the first embodiment is shown in FIG. 14.

FORMATION EXAMPLE 2

As a material of a capacitor film, a dielectric material having the perovskite structure of $ABO_3$, for example, one kind selected from $SrTiO_3$ (STO), (Ba, Sr)$TiO_3$ (BST), $SrZrO_3$, (Ba, Sr)(Zr, Ti)$O_3$, and so on is suitable.

In the present embodiment, at first, here, STO is used as the material, and it is deposited for film thickness of approximately 100 nm by, for example, the RE magnetron sputtering method, to form an STO thin film.

Next, the silicon semiconductor substrate 10 on which the STO thin film is formed is chemical cleaned by, for example, the hydrofluoric acid (HF) buffer solution.

The STO thin film is then put under, for example, the oxygen ($O_2$) atmosphere of 1 atm, and the annealing process is performed at, for example, approximately 450° C. for, for example, approximately one hour.

Figure 15:
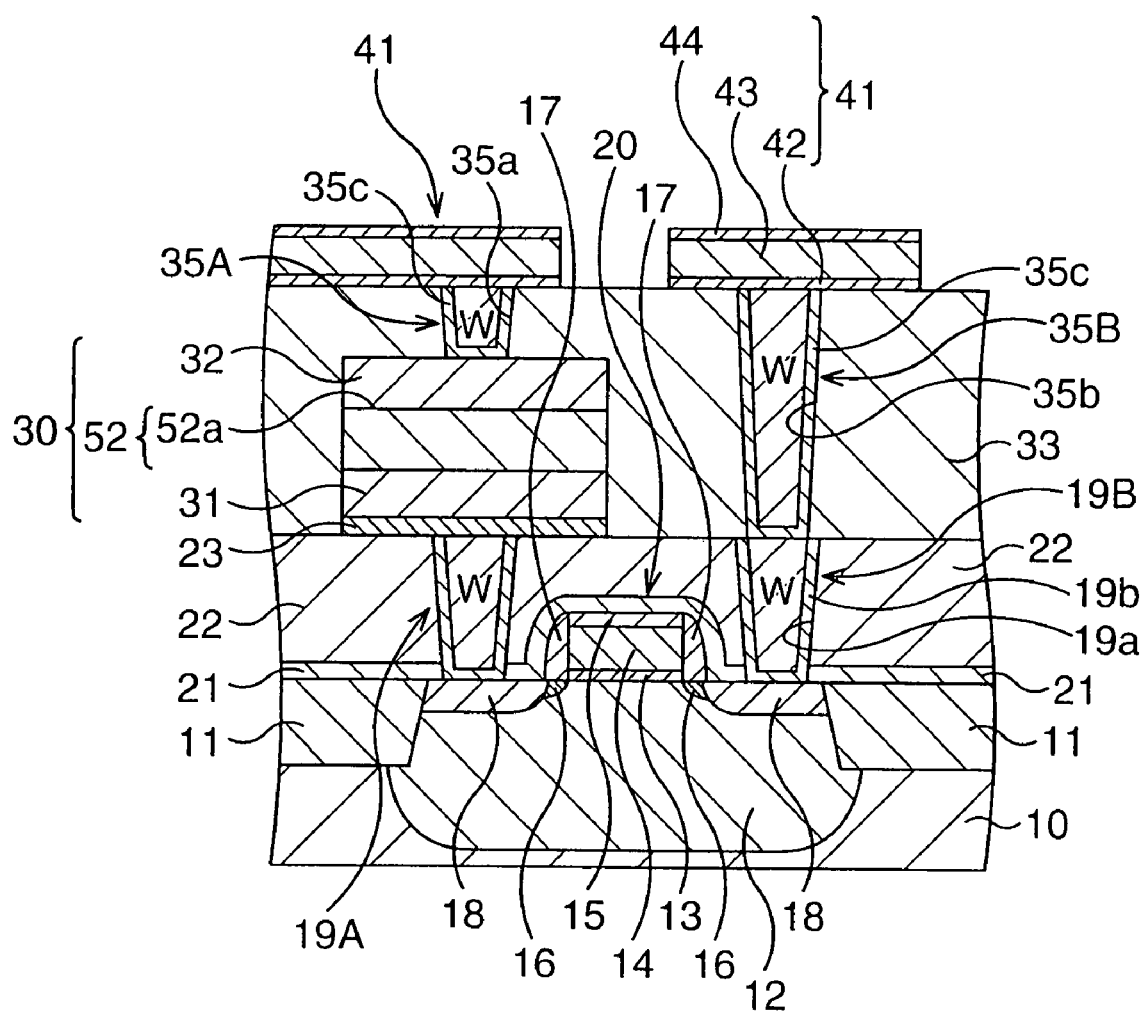
FIG. 15 is a schematic sectional view showing a stacked type semiconductor memory according to a formation example 2 of the second embodiment.

Accordingly, a capacitor film 52 in which a crystal structure at an uppermost surface 52a becomes a $TiO_2$ termination surface as much as possible (at the uppermost surface, a ratio of the $TiO_2$ termination surface relative to an SrO termination surface is large as much as possible) is formed. An appearance of a semiconductor memory corresponding to FIG. 13 in the first embodiment is shown in FIG. 15.

Incidentally, as the perovskite structure of $ABO_3$, $SrZrO_3$ or (Ba, Sr)(Zr, Ti)$O_3$ may be used instead of the BST thin film or the STO thin film in the formation examples 1, 2. When $SrZrO_3$ is used, the capacitor film 25 in which the crystal structure at the uppermost surface becomes a $ZrO_2$ termination surface as much as possible (at the uppermost surface, a ratio of the $ZrO_2$ termination surface relative to the SrO termination surface is large as much as possible) is formed. Besides, when (Ba, Sr)(Zr, Ti)$O_3$ is used, the capacitor film 25 in which the crystal structure at the uppermost surface becomes a (Zr, Ti)$O_2$ termination surface as much as possible (at the uppermost surface, a ratio of the (Zr, Ti)$O_2$ termination surface relative to a (Ba, Sr)O termination surface is large as much as possible) is formed.

As it is described hereinabove, according to the present embodiment, the capacitor film 25 of the capacitor element 30 is formed from the dielectric material having the perovskite structure of $ABO_3$, and thereby, it becomes possible to attain the low leak current for a long period of time while realizing further large capacity, and it becomes possible to realize the semiconductor memory with high reliability including the capacitor element 30 capable of improving various characteristics simultaneously.

Incidentally, in the formation examples 1, 2, the above-stated annealing process to be performed to the BST thin film or the STO thin film may be performed to the BST thin film or the STO thin film after, for example, the upper electrode film 26 is formed on the BST thin film or the STO thin film, to form the capacitor film 25 under the upper electrode film 26. In this case, a temperature of the annealing process is desirable to be set at 700° C. or less when the upper electrode film 26 is composed of Pt, at 900° C. or less when it is composed of $IrO_2$, at 400° C. or less when it is composed of Au, and therefore, it is good to set at 450° C. as stated above.

Besides, in the above-stated respective embodiments, the semiconductor memory is exemplified as the electronic device to which the present invention is applied, but the present invention is not limited to the above.

For example, it is possible to apply a capacitor element having a similar configuration with the above-stated capacitor element 30 for the capacitor element in the electronic device such as an FeRAM as another semiconductor memory, a filter capacitor separating a signal with a frequency component in a predetermined range from an electrical signal, a decoupling capacitor suppressing a voltage noise or a voltage variation generated by a coupling between power bus lines, an active variable element used for a microwave element and so on, and it is possible to achieve a similar excellent effect.

According to the present invention, it is possible to realize an electronic device with high reliability including a capacitor element which attains low leak current for a long period of time while realizing further large capacity, and capable of improving various characteristics simultaneously, in the capacitor element including a capacitor film composed of a dielectric material having a perovskite structure of $ABO_3$.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. An electronic device, comprising:
    a substrate; and
    a capacitor element sandwiching a capacitor film by a lower electrode and an upper electrode at upward of said substrate, and
    wherein the capacitor film is composed of a single dielectric material having a perovskite structure of $ABO_3$, and an uppermost surface of the $ABO_3$ material consists of a $BO_2$ termination surface.

2. The electronic device according to claim 1, wherein a B element of $ABO_3$ composing the capacitor film is Ti (titanium) or Zr (zirconium).

3. The electronic device according to claim 1, wherein an A element of $ABO_3$ composing the capacitor film is one kind selected from a group composed of Sr (strontium), Ba (barium), Ca (calcium), Mg (magnesium), Pb (lead), La (lanthanum), Y (yttrium), Bi (bismuth), or at least two kinds selected from the group.

4. An electronic device, comprising:
    a substrate; and
    a capacitor element sandwiching a capacitor film by a lower electrode and an upper electrode at upward of said substrate, and
    wherein the capacitor film is composed of a dielectric material containing at least strontium (Sr) and oxygen (O), and contains Sr(I) which is Sr (strontium) of which binding energy is low and Sr(II) of which binding energy is higher than Sr(I) which are two kinds of states of which binding energies are different, at a surface layer portion at a region of which depth is within 5 nm from a surface, and
    wherein an average concentration of Sr(I) at the surface layer portion is set as AC(I), an average concentration of Sr(II) at the surface layer portion is set as AC(II), and where R=AC(II)/AC(I),
    "0" (zero)<R≦0.3.

5. The electronic device according to claim 4,
    wherein the value of "R" of the capacitor film is:
    "0" (zero)<R≦0.1.

6. The electronic device according to claim 4, wherein the capacitor film is composed of one kind selected from $SrTiO_3$ (strontium titanium oxide), (Ba(barium), Sr(strontium))$TiO_3$ (titanium oxide), $SrZrO_3$ (strontium zirconium oxide), (Ba (barium), Sr (strontium))(Zr (zirconium), Ti (titanium))$O_3$ (oxide).

7. The electronic device according to claim 4,
    wherein a difference of the binding energy of Sr(II) and the binding energy of Sr(I) is a value within a range of 0.7 eV to 1.3 eV.

8. The electronic device according to claim 1,
    wherein the lower electrode is composed of one kind selected from a first group of Pt(platinum), Pd (palladium), Ir(iridium), Ru (ruthenium), Rh (rhodium), Re (rhenium), Os(osmium), Au (gold), Ag (silver), Cu (copper) or an alloy of at least two kinds selected from the first group, one kind selected from a second group of $PtO_x$ (platinum oxide), $IrO_x$ (iridium oxide), $RuO_x$ (ruthenium oxide) ("0" (zero)<x≦2) or a stacked structure of at least two kinds of oxides selected from the second group, or a stacked structure of the one kind selected from the first group or the alloy of at least the two kinds selected from the first group and the one kind selected from the second group or the stacked structure of at least the two kinds of oxides selected from the second group.

9. The electronic device according to claim 1,
    wherein the upper electrode is composed of one kind selected from a first group of Pt (platinum), Pd (palladium), Ir (iridium), Ru (ruthenium), Rh (rhodium), Re (rhenium), Os (osmium), Au (gold), Ag (silver), Cu (copper) or an alloy of at least two kinds selected from the first group, one kind selected from a second group of $PtO_x$ (platinum oxide), $IrO_x$ (iridium oxide), $RuO_x$ (ruthenium oxide) ("0" (zero)<x≦2), $SrRuO_3$ (strontium ruthenium oxide), $LaNiO_3$ (lanthanum nickel oxide) or a stacked structure of at least two kinds of oxides selected from the second group, or a stacked structure of the one kind selected from the first group or the alloy of at least the two kinds selected from the first group and the one kind selected from the second group or the stacked structure of at least the two kinds of oxides selected from the second group.

10. A manufacturing method of an electronic device including a substrate, and a capacitor element sandwiching a capacitor film by a lower electrode and an upper electrode at upward of the substrate, comprising:
    depositing a single dielectric material having a perovskite structure of $ABO_3$ on the lower electrode; and
    controlling a state of an uppermost surface of the deposited single dielectric material so that the uppermost surface of the $ABO_3$ material becomes a $BO_2$ termination surface,
    when the capacitor film is formed; and
    wherein the control is performed by putting the deposited dielectric material under an atmosphere containing oxygen and performing an annealing process at a temperature within a range of 100° C. to 900° C. in said controlling step of the uppermost surface.

11. The manufacturing method of the electronic device according to claim 10, wherein a B element of $ABO_3$ composing the capacitor film is Ti (titanium) or Zr (zirconium).

12. The manufacturing method of the electronic device according to claim 10, wherein an A element of $ABO_3$ composing the capacitor film is one kind selected from a group composed of Sr (strontium), Ba (barium), Ca (calcium), Mg (magnesium), Pb (lead), La (lanthanum), Y (yttrium), Bi (bismuth) or at least two kinds selected from the group.

13. The manufacturing method of the electronic device according to claim 10, further comprising:
    chemical cleaning the deposited dielectric material by hydrofluoric acid buffer solution,
    before the annealing process is performed.

14. A manufacturing method of an electronic device including a substrate, and a capacitor element sandwiching a capacitor film by a lower electrode and an upper electrode at upward of the substrate, comprising:

depositing a dielectric material containing at least strontium (Sr) and oxygen (O) on the lower electrode, and controlling a state of a surface layer portion so that Sr(I) being Sr (strontium) having a low binding energy and Sr(II) having the binding energy higher than Sr(I), which are two kinds of states of which binding energies are different, are contained at the surface layer portion at a region of which depth is within 5 nm from a surface of the deposited dielectric material, and an average concentration of Sr(I) at the surface layer portion is set as AC(I), an average concentration of Sr(II) at the surface layer portion is set as AC(II), and when R=AC (II)/AC (I), "0" (zero)<R≦0.3, when the capacitor film is formed.

15. The manufacturing method of the electronic device according to claim 14, wherein the value of "R" is adjusted to be:

"0" (zero)<R≦0.1, when the capacitor film is formed.

16. The manufacturing method of the electronic device according to claim 14, wherein the capacitor film is formed by using one kind selected from $SrTiO_3$ (strontium titanium oxide), (Ba (barium), Sr (strontium))$TiO_3$ (titanium oxide), $SrZrO_3$ (strontium zirconium oxide), (Ba (barium), Sr (strontium), and Zr (zirconium))$TiO_3$ (titanium oxide).

17. The manufacturing method of the electronic device according to claim 14, wherein the control is performed by putting the deposited dielectric material under an atmosphere containing oxygen and performing an annealing process at a temperature within a range of 100° C. to 900° C. in said controlling step of the surface layer portion.

18. The manufacturing method of the electronic device according to claim 17, wherein the annealing process is performed at the temperature within the range of 300° C. to 850° C.

19. The manufacturing method of the electronic device according to claim 17, further comprising:

immersing the deposited dielectric material in water; and immersing the deposited dielectric material in nitric acid, before the annealing process is performed.

20. The electronic device according to claim 1, wherein the capacitor film is formed by the RF magnetron sputtering method.

* * * * *